US009676101B2

(12) United States Patent
Inoue (10) Patent No.: US 9,676,101 B2
(45) Date of Patent: Jun. 13, 2017

(54) OPERATING PROGRAM WRITING SYSTEM

(71) Applicant: FANUC CORPORATION, Yamanashi (JP)

(72) Inventor: Kozo Inoue, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 75 days.

(21) Appl. No.: 14/168,325

(22) Filed: Jan. 30, 2014

(65) Prior Publication Data

US 2014/0214203 A1 Jul. 31, 2014

(30) Foreign Application Priority Data

Jan. 30, 2013 (JP) .................. 2013-015903

(51) Int. Cl.
| | |
|---|---|
| *G06F 7/60* | (2006.01) |
| *G06F 17/10* | (2006.01) |
| *B25J 9/16* | (2006.01) |
| *B25J 9/10* | (2006.01) |
| *G06F 17/50* | (2006.01) |

(52) U.S. Cl.
CPC ............ *B25J 9/1661* (2013.01); *B25J 9/10* (2013.01); *G05B 2219/36177* (2013.01); *G05B 2219/40099* (2013.01); *G06F 17/50* (2013.01); *Y02P 90/02* (2015.11)

(58) Field of Classification Search
CPC ...... B25J 9/1661; B25J 9/1602; B25J 9/1656; B25J 9/1671; B25J 11/005; B25J 9/10; G06F 17/50
USPC .......................................................... 703/2
See application file for complete search history.

(56) References Cited

U.S. PATENT DOCUMENTS 3,920,972 A * 11/1975 Corwin, Jr. .......... G05B 19/425
700/251
5,168,441 A 12/1992 Onarheim et al.
(Continued)

FOREIGN PATENT DOCUMENTS

| CN | 1046987 A | 11/1990 |
|---|---|---|
| CN | 1398214 A | 2/2003 |

(Continued)

OTHER PUBLICATIONS

Bruccoleri, M. et al., "UML Design and AWL Programming for Reconfigurable Control Software Development of a Robotic Manipulator", 2005, IEEE.*

*Primary Examiner* — Cedric D Johnson
(74) *Attorney, Agent, or Firm* — Hauptman Ham, LLP (57) ABSTRACT

An operating program writing system includes a block storing part which stores a plurality of blocks constituting work units of an operating program, a selecting part which selects any number of blocks from the plurality of blocks, a displaying part which displays a path diagram including the any number of blocks and arguments which are contained in the blocks, a selecting and inputting part which selects at least one block among the any number of blocks and inputs the arguments of the at least one block, a running part which arranges run buttons for the respective any number of blocks and runs blocks which correspond to the run buttons, and a writing part which uses the any number of blocks and the input argument of the at least one block as the basis to write an operating program.

4 Claims, 7 Drawing Sheets

(56) References Cited

U.S. PATENT DOCUMENTS

| | | | |
|---|---|---|---|
| 5,555,179 A * | 9/1996 | Koyama | G05B 19/41835 |
| | | | 700/95 |
| 2005/0107919 A1 | 5/2005 | Watanabe et al. | |
| 2007/0150102 A1 * | 6/2007 | Park | B25J 9/1661 |
| | | | 700/245 |
| 2011/0071676 A1 * | 3/2011 | Sanders et al. | 700/250 |
| 2012/0317535 A1 | 12/2012 | Schmirgel et al. | |

FOREIGN PATENT DOCUMENTS

| | | |
|---|---|---|
| CN | 102854831 A | 1/2013 |
| DE | 102010012598 A1 | 9/2011 |
| JP | 08-249026 A | 9/1996 |
| JP | 2002120174 A | 4/2002 |
| JP | 2002205291 A | 7/2002 |
| JP | 2004152560 A | 5/2004 |
| JP | 3905075 B2 | 4/2007 |
| JP | 2009-80737 A | 4/2009 |
| JP | 5058063 B2 | 11/2009 |
| JP | 2011238041 A * | 11/2011 |
| JP | 2012198775 A | 10/2012 |

\* cited by examiner

OPERATING PROGRAM WRITING SYSTEM

RELATED APPLICATIONS

The present application claims priority to Japanese Application Number 2013-015903, filed Jan. 30, 2013, the disclosure of which is hereby incorporated by reference herein in its entirety.

BACKGROUND OF THE INVENTION

1. Field of the Invention

The present invention relates to an operating program writing system which writes an operating program of a system comprised of a combination of a peripheral and a robot.

2. Description of the Related Art

An industrial robot which is provided with a hand which clamps a workpiece often processes the workpiece in coordination with a machine tool or other peripheral. Further, a controller controls the system comprised of the robot and peripheral in accordance with a predetermined operating program. When the peripheral and workpiece etc. are changed, that operating program has to be suitably changed.

In Japanese Patent No. 3905075, arguments which correspond to teaching positions of an operating program are defined and position information is input to the arguments in accordance with the work content. Further, in Japanese Patent No. 5058063, the operating program is divided into a plurality of blocks corresponding to work units and the blocks are suitably combined. Furthermore, Japanese Patent Publication No. 8-249026A proposes a programming method which uses icons to assemble a work sequence on the screen of a computer. In this way, in the prior art, a new operating program has been edited in accordance with the work content.

However, in the prior art, even when completing a new operating program, it was necessary to actually run the operating program to judge the validity of the operating program. In other words, in the prior art, until actually running the operating program, its validity could not be judged. For this reason, when actually running the operating program, for example, sometimes the trouble of the workpiece which was held by the hand of the robot striking the peripheral etc. was found. Further, in such a case, it was necessary to again correct the operating program and again run the corrected operating program to confirm if there is trouble or not. Such work was complicated. Further, tremendous time was required.

Further, in the prior art, since the operating program was actually run to judge its validity, it was difficult to use a system which edits the operating program for maintaining the routine operation of the robot.

Furthermore, the work of dividing an existing operating program into a plurality of blocks in accordance with the work content required tremendous time. For this reason, it was difficult to introduce such a system for dividing an operating program into a plurality of blocks, into a robot where an existing operating program was being used.

The present invention was made in consideration of this situation and has as its object the provision of an operating program writing system which is able to simply judge the validity of a new operating system before it is completed.

SUMMARY OF INVENTION

To achieve the above-mentioned object, according to a first aspect, there is provided an operating program writing system which writes an operating program of a system which is comprised of a peripheral and a robot, the operating program writing system comprising a block storing part which stores a plurality of blocks constituting work units of the operating program, a selecting part which selects any number of blocks which form the operating program from the plurality of blocks, a displaying part which displays a path diagram which is comprised of the any number of blocks which are selected by the selecting part and arguments which are contained in the blocks, a selecting and inputting part which selects at least one block among the any number of blocks at the displaying part and inputs the arguments of the at least one block, a running part which arranges run buttons for the respective any number of blocks on the displaying part and runs blocks which correspond to the run buttons by the run buttons being operated by the selecting and inputting part, and a writing part which uses the any number of blocks which were selected by the selecting part and the argument which was input in the at least one block which was selected by the selecting and inputting part as the basis to write an operating program.

According to a second aspect, there is provided the first aspect wherein the displaying part displays the running states of the blocks in the path diagram.

According to a third aspect, there is provided the first aspect which further comprises a setting part which analyzes an existing operating program and sets a plurality of blocks and arguments which are contained in the blocks from the existing operating program.

These and other objects, features, and advantages of the present invention will become clearer from the detailed description of typical embodiments of the present invention which are shown in the attached drawings.

DETAILED DESCRIPTION

Below, embodiments of the present invention will be explained with reference to the attached drawings. In the following figures, similar members are assigned similar reference notations. To facilitate understanding, these figures are suitably changed in scale.

Figure 1:
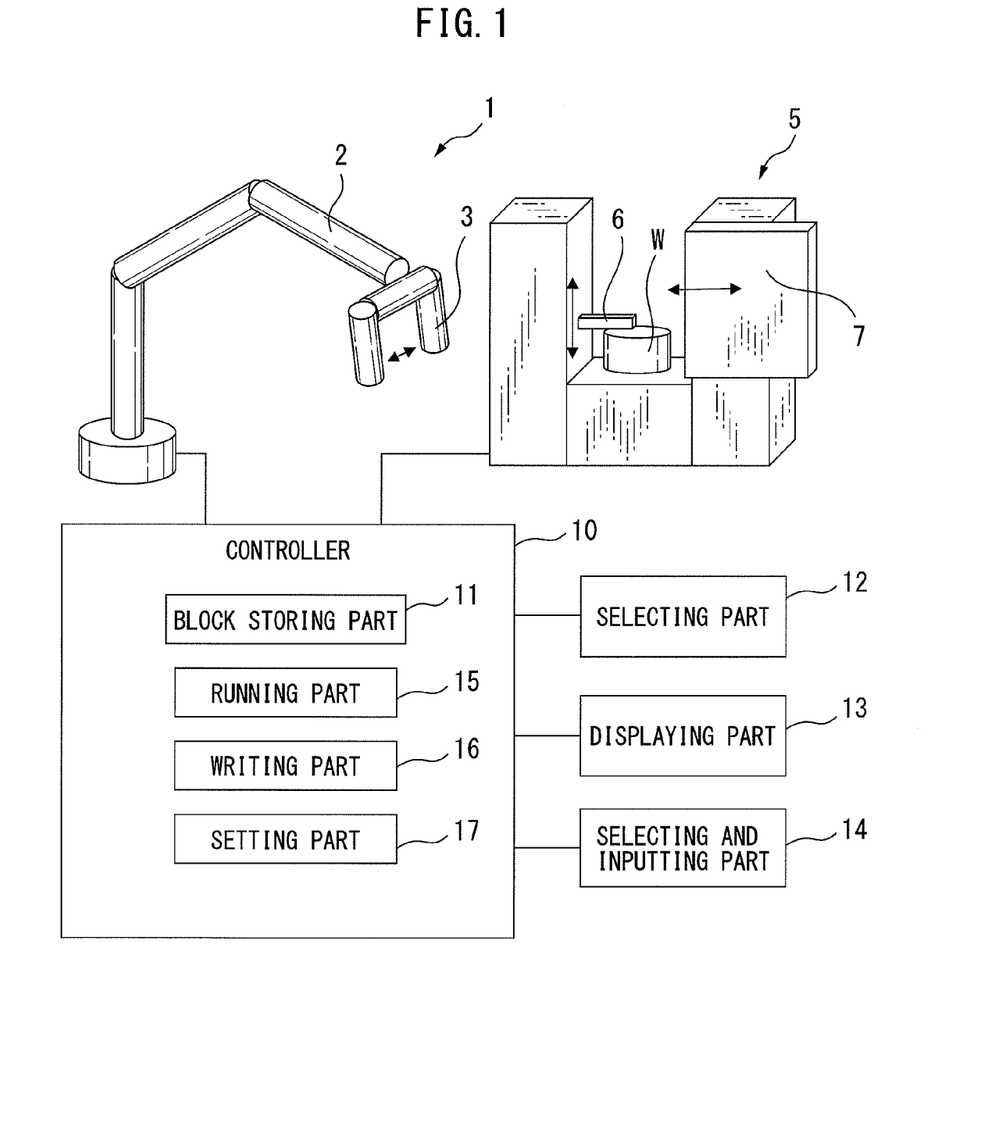
FIG. 1 is a view which shows a system including an operating program writing system based on the present invention.

FIG. 1 is a view which shows a system including an operating program writing system based on the present invention. The system 1 which is shown in FIG. 1 mainly includes a robot 2, a machine tool 5, and a controller 10 which is connected to the robot 2 and the machine tool 5. As illustrated, the robot 2 is a multiarticulated robot which is provided with an arm 3 at its front end. The arm 3 opens and closes in accordance with instructions from the controller 10 and clamps and releases a workpiece W.

The machine tool 5 is provided with a clamper 6 which descends and clamps a workpiece W at a base of the machine tool 5 and an opening/closing door 7. If the workpiece W is clamped by the clamper 6, the door 7 closes and a working tool (not shown) processes the workpiece W.

The controller 10 is a digital computer. It controls the operations of the robot 2 and the machine tool 5 and acts as an operating program writing system which writes the operating program of the system 1. Note that, while not shown in the figure, the operating program writing system 10 may also be an off-line programming system which enables a simulation operation on screen. Further, the robot 2 and the machine tool 5 may be different types than the above types. Furthermore, the case where system 1 includes just one of the robot 2 or the machine tool 5 and the case of a system where a robot 2 is combined with other peripherals are also included in the scope of the present invention.

As shown in FIG. 1, the controller 10 has a block storing part 11 which stores a plurality of blocks constituting work units of the operating program. Further, a selecting part 12 which selects any number of blocks which form the operating program from the plurality of blocks, a displaying part 13 which displays a path diagram which is comprised of the any number of blocks which were selected by the selecting part 12 and arguments which are contained in the blocks, and a selecting and inputting part 14 which selects at least one block among the any number of blocks at the displaying part 13 and inputs the arguments of the at least one block are connected to the controller 10. The selecting part 12 may be a mouse, keyboard, etc., while the displaying part 13 may be, for example, a liquid crystal display, CRT, etc. Furthermore, the selecting and inputting part 14 may be, for example, a mouse, keyboard, etc. and may be common with the selecting part 12.

Furthermore, the controller 10 includes a running part 15 which arranges run buttons on the displaying part 13 for each of the plurality of blocks and which runs blocks which correspond to the run buttons by the run buttons being operated by the selecting and inputting part 14 and a writing part 16 which uses the any number of blocks which were selected by the selecting part 12 and the input arguments of the at least one block which was selected by the selecting and inputting part 14 as the basis to write an operating program. Furthermore, the controller 10 includes a setting part 17 which analyzes an existing operating program to set a plurality of blocks and arguments to be contained in the blocks from the existing operating program.

Figure 2:
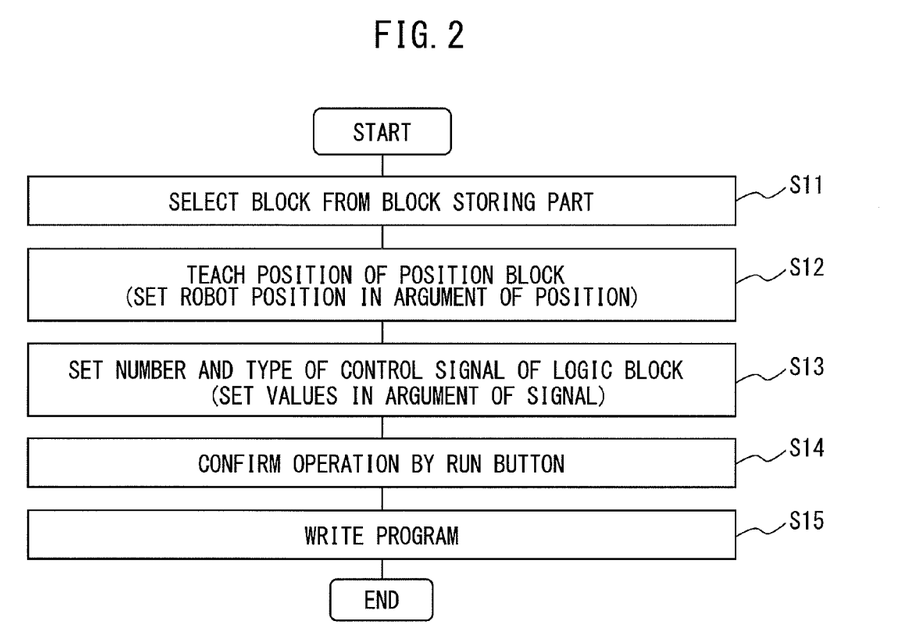
FIG. 2 is a flowchart which shows one operation of the operating program writing system which is shown in FIG. 1.

FIG. 2 is a flowchart which shows one operation of the operating program writing system which is shown in FIG. 1. Below, while referring to FIG. 1 and FIG. 2, the operation of the operating program writing system of the present invention will be explained. First, at step S11, the operator selects from the block storing part 11 any number of blocks which are required for forming an operating program.

Figure 3:
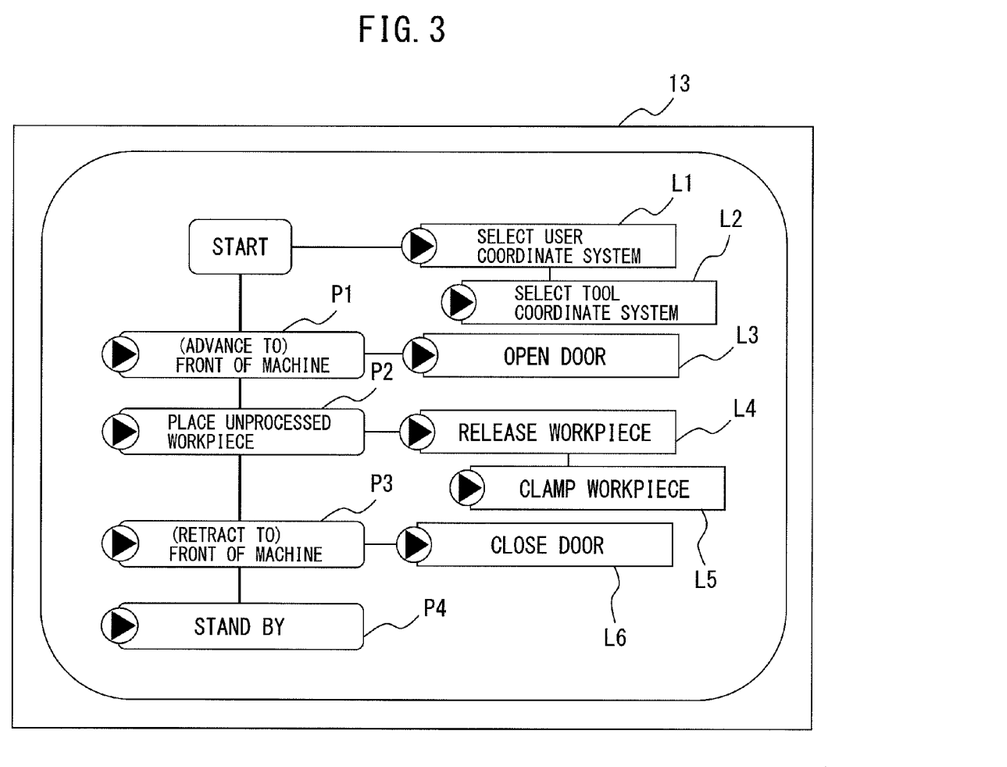
FIG. 3 is an enlarged view of a displaying part which is shown in FIG. 1.

FIG. 3 is an enlarged view of a displaying part which is shown in FIG. 1. The plurality of blocks which were selected at at step S11 are displayed at the displaying part 13. As can be seen from FIG. 3, at step S11, the blocks "SELECT USER COORDINATE SYSTEM" L1, "SELECT TOOL COORDINATE SYSTEM" L2, "(ADVANCE TO) FRONT OF MACHINE" P1, "OPEN DOOR" L3, "PLACE UNPROCESSED WORKPIECE" P2, "RELEASE WORKPIECE" L4, "CLAMP WORKPIECE" L5, "(RETRACT TO) FRONT OF MACHINE" P3, "CLOSE DOOR" L6, "STAND BY" P4 are selected. While not shown in the figure, the block storing part 11 is assumed to also store blocks which show other work.

Each of these blocks is an element which forms part of the operating program. These blocks are suitably combined to thereby form a single operating program. Each of the plurality of blocks which is stored at the block storing part 11 is a kind of template which shows a work unit. Further, as can be seen from FIG. 3, the selected plurality of blocks are arranged in an order so as to form an operating program and form a path diagram. The order of the plurality of blocks may be suitably determined by the operator. Alternatively, the selected plurality of blocks may be automatically arranged in accordance with a predetermined order.

Figure 4:
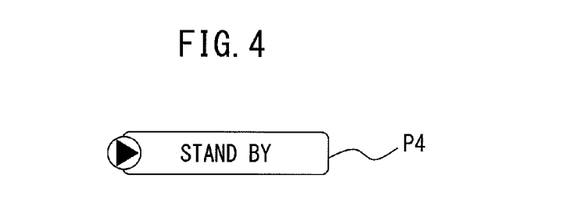
FIG. 4 is a view which shows one block in a path diagram which is shown in FIG. 3.
Figure 5:
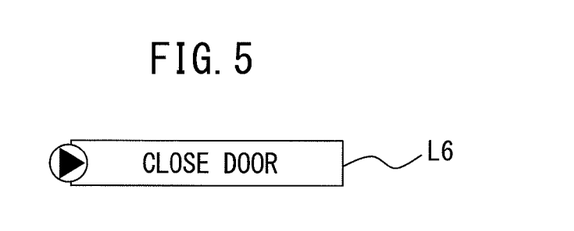
FIG. 5 is a view which shows another block in a path diagram which is shown in FIG. 3.

In this regard, FIG. 4 is a view which shows one block P4 in the path diagram which is shown in FIG. 3, while FIG. 5 is a view which shows another block L6 in a path diagram which is shown in FIG. 3. The block P4 which is shown in FIG. 4 and the blocks P1 to P3 which are shown in FIG. 3 are rounded corner blocks, while the block L6 which is shown in FIG. 4 and the blocks L1 to L5 which are shown in FIG. 3 are sharp corner blocks.

The blocks P1 to P4 are position blocks which teach to what positions the robot 2 moves. As opposed to this, the blocks L1 to L6 are logic blocks which teach what kind of operations to perform.

Returning again to FIG. 2, at step S12, the positions of the position blocks P1 to P4 are set. Specifically, the operator uses the selecting and inputting part 14 to select one position block, for example, the position block P1, and input the desired position information as an argument. Further, the operator inputs position information in the same way for the other position blocks P2 to P4.

Then, at step S13, the types and numbers of the control signals of the logic blocks L1 to L6 are set. Specifically, the operator uses the selecting and inputting part 14 to select one logic block, for example, the logic block L1, and input the types and numbers of the control signals which are required as the argument.

For example, when the hand 3 of the robot 2 is used, robot signals are selected as the types of the control signals. Similarly, when a peripheral, for example, a machine tool 5, is used, digital signals are selected as the types of the control signals. Further, for example, as the numbers of the control signals, the No. 1 signal which opens the hand 3 of the robot 2 and the No. 2 signal which closes the hand 3 are set. Similarly, the No. 1 signal which opens the door 7 of the machine tool 5 and the No. 2 signal which closes the door 7 are set. The types and numbers of such control signals are set in advance as a table. Therefore, the operator can use the selecting and inputting part 14 to select the types and numbers of the control signals of the logic blocks L1 to L6 from the table.

Figure 6:
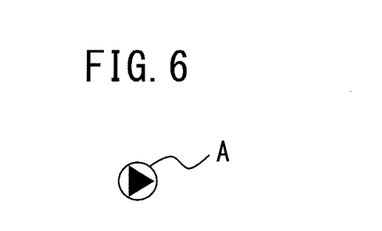
FIG. 6 is a view which shows a run button which is shown in FIG. 3.

Then, when the position blocks P1 to P4 and the logic blocks L1 to L6 finished being set, at step S14, the running part 15 arranges a run button A which is shown in FIG. 6 for each of the blocks P1 to P4 and L1 to L6 (in FIG. 3, run buttons A are already arranged for all of the blocks).

Further, the operator uses the selecting and inputting part 14 to push a run button A which is arranged at a desired block. Alternatively, when the operator desires it, he may push the run buttons A of all of the blocks P1 to P4 and the blocks L1 to L6.

Due to this, only the blocks which correspond to the pushed run buttons A are actually run. For example, when the run button A of the position block P2 is pushed, the robot 2 makes the unprocessed workpiece W actually move to a predetermined position. Alternatively, when the run button A of the logic block L3 is pushed, the door 7 of the machine tool 5 is actually opened.

In this way, in the present invention, the actual operation of the operating program can be confirmed for each block. Therefore, when changing the type of the workpiece or even when changing the machine tool 5 to another machine tool, it is possible to easily confirm if the robot 2 etc. will interfere with a peripheral. This is particularly advantageous when changing only part of the operating program. It is sufficient to confirm the operation to the minimum extent.

Finally, when the operation of the desired block finishes being confirmed, at step S15, the writing part 16 uses the block, operation of which finished being confirmed as the basis to write the operating program of the system 1. Specifically, the writing part 16 arranges the selected blocks P1 to P4 and L1 to L6 in a suitable order based on predetermined rules to write a new operating program.

In this way, in the present invention, before newly writing an operating program, the run buttons A can be used to run the blocks P1 to P4 and L1 to L6 to confirm the operations of the contents of the blocks. Therefore, it becomes possible to simply judge the validity of a new operating program before it is completed. Further, each of the plurality of blocks P1 to P4 and L1 to L6 is provided with a run button A, so the operation of moving a cursor or selecting a black can be eliminated. As a result, it is possible to shorten the time which is required for editing an operating program.

Further, the blocks P1 to P4 and L1 to L6 at which trouble occurs may be run again after inputting other position information or information of control signals. Therefore, the operating program writing system of the present invention can also be utilized for maintaining the routine operation of the system 1.

Figure 7:
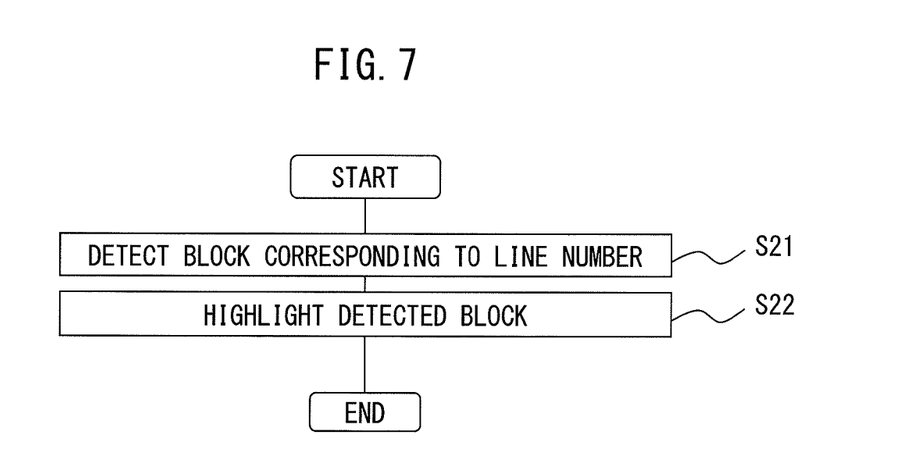
FIG. 7 is a flowchart which shows another operation of the operating program writing system.

FIG. 7 is a flowchart which shows another operation of the operating program writing system. The operation which is shown in FIG. 7 is run at the same time at step S14 of FIG. 2. Alternatively, the operation which is shown in FIG. 7 may also be run after the operating program of the system 1 is written at step S15 of FIG. 2.

Figure 8:
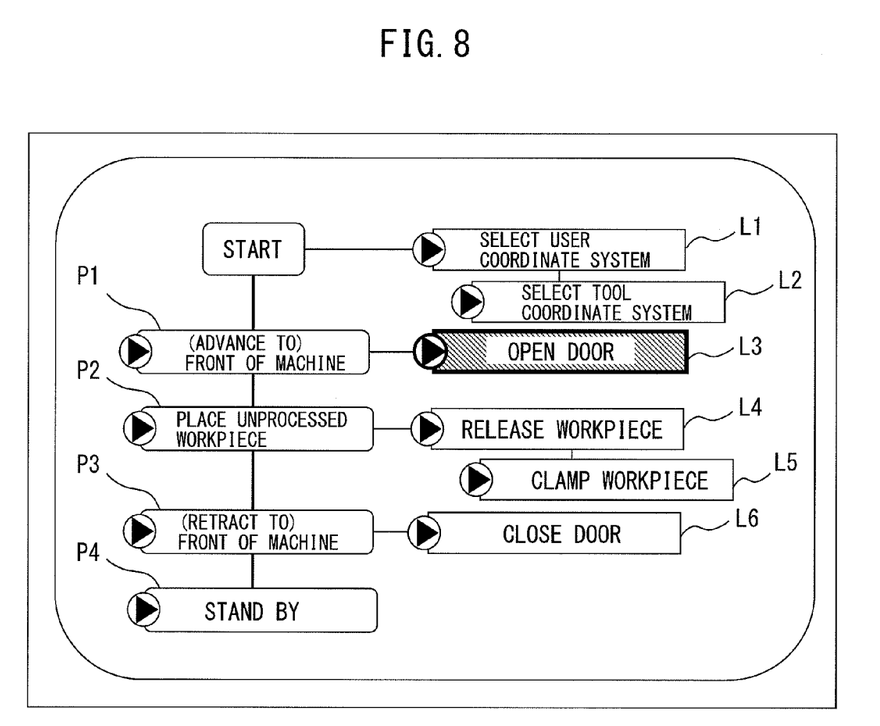
FIG. 8 is another enlarged view of a displaying part.

At step S21 of FIG. 7, a block which corresponds to a line number of an operating program which is written, is detected. Further, at step S22 of FIG. 7, the block which is detected is highlighted on the path diagram of the displaying part 13. In another enlarged view of the displaying part given in FIG. 8, the block L3 "OPEN DOOR" is highlighted. Therefore, the operator can visually confirm the running state of the block on the path diagram which is displayed on the displaying part 13.

Note that, at step S14 of FIG. 2, when the run buttons A of a plurality of blocks are pressed, the contents of the corresponding blocks are run in a predetermined order. In this case, only the currently running blocks are highlighted. Further, when the blocks are highlighted, the contents of the blocks are run. Therefore, when trouble occurs, it is possible to easily identify the block relating to that trouble and change it again.

In this regard, in many case the system 1 already has an existing operating program. Further, when changing for example the machine tool 5 of the system 1, the existing operating program has to be changed. In such a case, to draw a path diagram of the existing operating program, the setting part 17 of the control device 10 performs the following operation.

Figure 9:
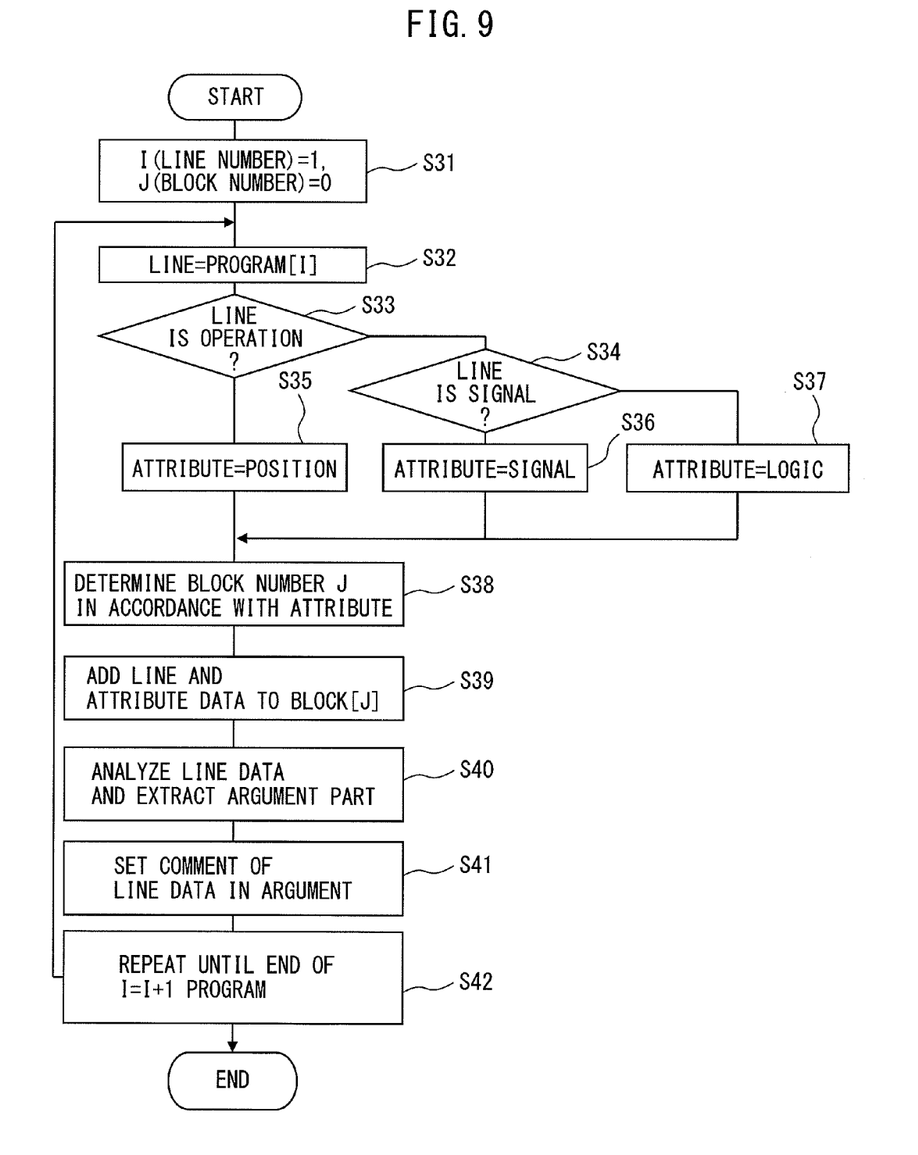
FIG. 9 is a flowchart which shows still another operation of the operating program writing system.

FIG. 9 is a flowchart which shows still another operation of the operating program writing system. After the setting part 17 reads in the existing operating program, the processing which is shown in FIG. 9 is performed. In this connection, the existing operating program is for example the following:

1, USER FRAME=1;
2, TOOL FRAME=1;
3, LINEAR POSITION [1: (ADVANCE TO) FRONT OF MACHINE] 2000 mm/sec POSITIONING;
4, DO[1]=ON;
5, STAND BY DI[1]=ON;
6, LINEAR POSITION [2: PLACE UNPROCESSED WORKPIECE] 2000 mm/sec POSITIONING;
7, RO[2]=ON;
8, STAND BY RI[2]=ON;
9, DO[3]=ON;
10, STAND BY DI[3]=ON;
11, LINEAR POSITION [3: (RETRACT TO) FRONT OF MACHINE] 2000 mm/sec POSITIONING;
12, DO[2]=ON;
13, STAND BY DI[2]=ON;
14, LINEAR POSITION [4: STAND BY] 2000 mm/sec The last number at the left at each line shows the line number of the operating program.

At step S31 which is shown in FIG. 9, the line number I of the operating program is set to "1" and the block number J is set to 0. Further, at step S32, the content of the I-th line of the operating program (line) is examined and it is judged if the line relates to an operation (step S33).

When the line relates to an operation, for example, when it relates to movement of the robot 2, at step S35, it is judged that the attribute of the line is a position. For example, the line numbers I=3, 6, 11, and 14 have the attributes of position.

As opposed to this, when the line is not one relating to an operation, at step S34, it is judged that the line relates to a control signal. In such a case, at step S36, it is judged that the attribute of the line is a signal. If not, at step S37, it is judged that the attribute of the line is a logic.

Then, the routine proceeds to step S38 where the setting part 17 sets the block number J in accordance with the respective attribute. The operating program to which the block number J is attached becomes as follows:

1, 1, USER FRAME=1;
2, 2, TOOL FRAME=1;
3, 3, LINEAR POSITION [1: (ADVANCE to) FRONT OF MACHINE] 2000 mm/sec POSITIONING;
4, 4, DO[1]=ON;
5, 4, STAND BY DI[1]=ON;
6, 5, LINEAR POSITION [2: PLACE UNPROCESSED WORKPIECE] 2000 mm/sec POSITIONING;
7, 6, RO[2]=ON;
8, 6, STAND BY RI[2]=ON;
9, 7, DO[3]=ON;
10, 7, STAND BY DI[3]=ON;
11, 8, LINEAR POSITION [3: (RETRACT TO) FRONT OF MACHINE] 2000 mm/sec POSITIONING;
12, 9, DO[2]=ON;
13, 9, STAND BY DI[2]=ON;
14, 10, LINEAR POSITION [4: STAND BY] 2000 mm/sec The second number from the left shows the block number of the operating program.

As can be seen from the operating program to which the block number J is attached, a line of a position attribute and a line of a logic attribute are written as independent blocks. Further, for example, DO[1]=ON" of the line number I=4 has the attribute of a control signal. Further, the line of this line number follows the "STAND BY DI[1]=ON" (logic attribute) of the block number J=4. In this way, when a line of a control signal attribute follows a line of a logic attribute, the line of the control signal attribute is made the same block as the related line of the logic attribute. The other block numbers J=6, 7, and 9 are similarly processed.

Then, the routine proceeds to step S39 where the number of blocks which correspond to all the block numbers J are successively arranged at the displaying part 13 and lines and attribute data are added in the blocks. Further, at step S40, each line is analyzed to extract the argument part. Furthermore, at step S41, a comment on the line data is set as an argument. Finally, at step S42, the line number I is incremented by "1". The operation from step S32 to step S42 is repeated until the final line.

Figure 10:
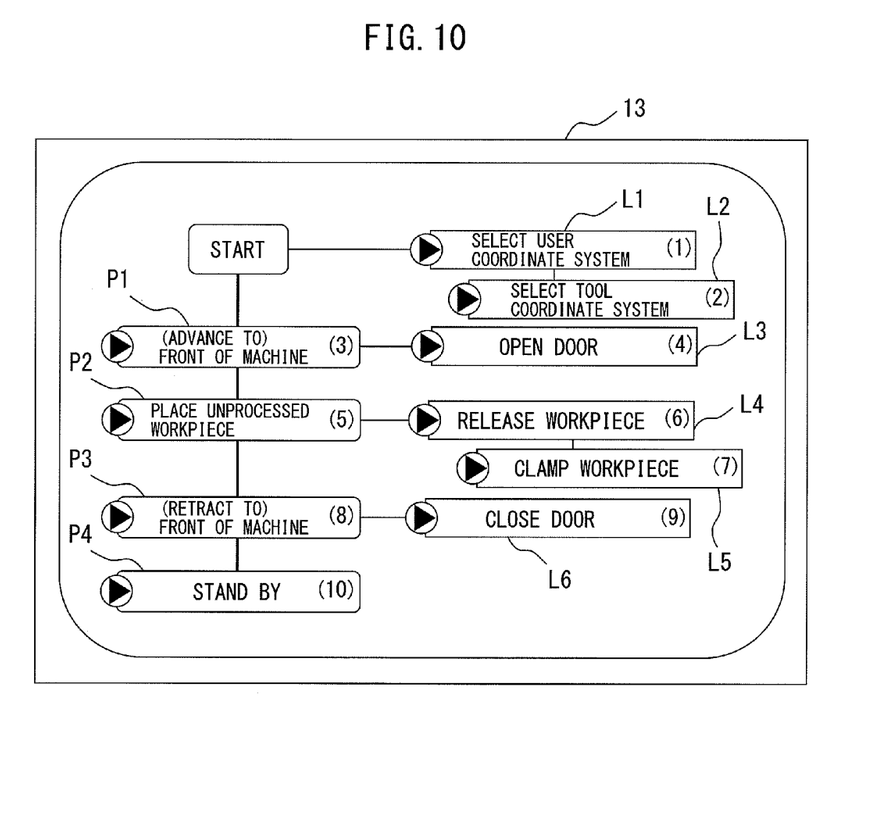
FIG. 10 is a view which shows a path diagram which is obtained by FIG. 9.

FIG. 10 is a view which shows a path diagram which is obtained by FIG. 9. This is generally similar to the path diagram which is shown in FIG. 3 etc. However, in the blocks P1 to P4 and L1 to L6 in FIG. 10, the block numbers J are shown in parentheses. Note that, the names of the blocks may be changed by the operator after writing the path diagram.

In this way, in the present invention, the setting part 17 divides the lines of an existing operating program into blocks of positional attributes and blocks of logic attributes and sets arguments in the blocks. Therefore, it is sufficient for the operator to only use the selecting and inputting part 14 to select a desired block and suitably change its argument. Due to this, even when changing for example a machine tool 5 of the system 1, it is possible to easily change the existing operating program.

In this way, in the present invention, it is possible to automatically write a path diagram from an existing operating program and possible to reutilize the existing operating program. For this reason, compared with when writing the path diagram from the start, the load of the operator can be lightened. Note that, in FIG. 9 and FIG. 10, an existing operating program is divided into lines of movement instructions, lines of signal instructions, and other lines (logic attributes) to write a path diagram. However, it is also possible to use the conditional sentences and label sentences of the operating program to prepare a path diagram. Such a case as well is included in the scope of the present invention.

Advantageous Effects of Invention

In the first aspect, it is possible to use a run button to run each block and confirm operation of the content of the block before a new operating program is completed. Therefore, it becomes possible to simply judge the validity of a new operating program before it is completed. Further, since each of the plurality of blocks is provided with a run button, the operation of the operator moving a cursor or selecting a block can be eliminated and the time which is required for editing the operating program can be shortened. Further, by inputting a separate argument and again running a block at which trouble occurs, it is possible to easily maintain routine operation.

In the second aspect, it is possible to confirm the running state of each block on the path diagram which is displayed on the displaying part. Further, it is possible to easily identify a block at which trouble occurs.

In the third aspect, it is possible to reuse an existing operating program.

Typical embodiments were used to explain the present invention, but a person skilled in the art would understand that the above-mentioned changes and various other changes, deletions, and additions may be made without departing from the scope of the present invention.

The invention claimed is:

1. An operating program writing system configured to write an operating program of a system which comprises a peripheral and a robot, the operating program writing system comprising:
 a display;
 an input device; and
 a computer coupled to the display and the input device, wherein:
 the computer stores a plurality of blocks, each of which is a work unit constituting the operating program;
 the input device accepts selection of any number of blocks to be combined to form the operating program from said plurality of blocks stored in the computer;
 the display displays a path diagram in which the any number of blocks, which are selected by the input device, are arranged in accordance with a predetermined order so as to form the operating program;
 the input device further:
  accepts selection of at least one block among the any number of blocks displayed in the path diagram at the display, and
  after said selection of the at least one block, receives an input argument of the selected at least one block;
 the computer further:
  arranges run buttons for the respective any number of blocks on the display,
  runs blocks which correspond to said run buttons in response to said run buttons being operated by said input device, and
  writes the operating program by using (i) the any number of blocks which were selected by said input device and (ii) the input argument of said at least one block which was selected by said input device as the basis to arrange the any number of blocks in accordance with the predetermined order in the operating program, wherein:
 the any number of blocks comprises position blocks and logic blocks,
 the position blocks are arranged in the predetermined order in said path diagram displayed by the display, and each of the position blocks indicates a position where the robot is to be moved to,
 each of the logic blocks is associated with a corresponding position block among the position blocks, and indicates an operation to be performed by the robot at said corresponding position block, and
 the position blocks are connected to each other in series so that each position block is connected to another position block without a logic block between said each position block and said another position block.

2. The operating program writing system according to claim 1, wherein the display displays running states of the blocks in said path diagram.

3. The operating program writing system according to claim 1, wherein the computer further comprises:
 analyzes an existing operating program, and
 sets a plurality of blocks and arguments which are contained in the blocks from the existing operating program.

4. The operating program writing system according to claim 1, wherein the computer further runs the block corresponding to a run button being operated by said input device independently of other blocks among the any number of blocks displayed at the display.

\* \* \* \* \*